United States Patent
Ikeda et al.

(10) Patent No.: US 9,112,429 B2
(45) Date of Patent: Aug. 18, 2015

(54) POWER CONVERTER USING A FIELD EFFECT TRANSISTOR AND A DIODE

(75) Inventors: Matahiko Ikeda, Chiyoda-ku (JP); Masaru Kobayashi, Chiyoda-ku (JP); Naoki Moritake, Chiyoda-ku (JP); Takao Mitsui, Chiyoda-ku (JP); Hirotoshi Maekawa, Chiyoda-ku (JP); Satoshi Ishibashi, Chiyoda-ku (JP); Shinsuke Idenoue, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 551 days.

(21) Appl. No.: 13/365,892

(22) Filed: Feb. 3, 2012

(65) Prior Publication Data

US 2013/0002227 A1 Jan. 3, 2013

(30) Foreign Application Priority Data

Jun. 29, 2011 (JP) ................................. 2011-143913

(51) Int. Cl.
*H02M 1/32* (2007.01)
*H02M 7/5387* (2007.01)
*H02M 3/337* (2006.01)
(Continued)

(52) U.S. Cl.
CPC ............ *H02M 7/5387* (2013.01); *H02M 3/156* (2013.01); *H02M 3/3376* (2013.01); *H02M 2001/0009* (2013.01); *H02M 2001/327* (2013.01)

(58) Field of Classification Search
CPC ............ H02M 2001/0009; H02M 2001/0032; H02M 2001/327; H02M 3/156; H02M 3/3376; H02M 7/5387
USPC .................................................... 363/98, 132
See application file for complete search history.

(56) References Cited

U.S. PATENT DOCUMENTS

| 5,726,870 A | 3/1998 | Lavieville et al. |
| 6,847,532 B2 * | 1/2005 | Villaret ........................ 363/132 |

(Continued)

FOREIGN PATENT DOCUMENTS

| JP | 10-056783 A | 2/1998 |
| JP | 2007-202330 A | 8/2007 |

(Continued)

OTHER PUBLICATIONS

Japanese Office Action dated Apr. 16, 2013 issued in Japanese Patent Application No. 2011-143913. English language translation.
Chinese Office Action dated Apr. 3, 2014 issued in Chinese Patent Application No. 201210119111.5.

*Primary Examiner* — Jue Zhang
*Assistant Examiner* — Lakaisha Jackson
(74) *Attorney, Agent, or Firm* — Sughrue Mion, PLLC; Richard C. Turner

(57) ABSTRACT

A power converter has one set of two semiconductor switches performing switching actions, each of which is formed of an FET and a free wheel diode connected in anti-parallel to the FET, and a smoothing capacitor, and convers power by complementary switching actions of the FETs in the semiconductor switches. The power converter is provided with a current sensor that detects a direction of a current flowing through the semiconductor switches and a gate generation portion that skips ON signals of PWM gate signals of the semiconductor switches when the direction of the current flowing through the semiconductor switches is negative.

17 Claims, 11 Drawing Sheets

(51) Int. Cl.
*H02M 3/156* (2006.01)
*H02M 1/00* (2007.01)

(56) References Cited

U.S. PATENT DOCUMENTS

| | | | | |
|---|---|---|---|---|
| 7,595,615 | B2 * | 9/2009 | Li et al. | 323/277 |
| 8,649,187 | B2 * | 2/2014 | Aiello et al. | 363/17 |
| 2009/0128113 | A1 * | 5/2009 | Ryoo | 323/283 |
| 2010/0309700 | A1 * | 12/2010 | Maeda et al. | 363/126 |
| 2011/0018481 | A1 * | 1/2011 | Hiller | 318/400.26 |

| | | | |
|---|---|---|---|
| 2012/0212195 | A1 * | 8/2012 | Kushida et al. ............... 323/271 |

FOREIGN PATENT DOCUMENTS

| JP | 2007-305836 A | 11/2007 |
|---|---|---|
| JP | 2008-211703 A | 9/2008 |
| JP | 2008-211956 A | 9/2008 |
| JP | 2009-095232 A | 4/2009 |
| JP | 2010-098820 A | 4/2010 |
| JP | 2010-259241 A | 11/2010 |
| JP | 2010259241 A | 11/2010 |
| JP | 2011-036032 A | 2/2011 |

* cited by examiner

POWER CONVERTER USING A FIELD EFFECT TRANSISTOR AND A DIODE

BACKGROUND OF THE INVENTION

1. Field of the Invention

The present invention relates to a power converter using a field effect transistor and a diode.

2. Description of the Related Art

As a power converter using a wide band-gap semiconductor device in the related art, there is a voltage-sourced power converter. This power converter has two semiconductor switches each of which is formed of an FET (Field Effect Transistor) using a wide band-gap semiconductor and a free wheel diode using a wide band-gap semiconductor and connected inversely in parallel (connected in anti-parallel) to the FET. These two semiconductor switches are connected to a capacitor functioning as a voltage source. The power converter converts power by complementary switching actions of the FETs in the two semiconductor switches.

An FET and a diode both using a wide band-gap semiconductor are operable at high temperatures and have a small switching loss relative to an IGBT and a diode both using a silicon semiconductor. Accordingly, by replacing the silicon semiconductor with the wide band-gap semiconductor, it becomes possible to reduce an area of the semiconductor and to make a cooler cooling the semiconductor simpler. Also, because passive component parts, such as a capacitor and a reactor, can be miniaturized owing to high-frequency switching, it becomes possible to downsize the power converter.

When an FET is used as the semiconductor switching device, it is possible to use an internal parasitic diode (body diode) of the FET instead of using the free wheel diode. Nevertheless, the free wheel diode is used because a characteristic of switching actions can be improved by using a Schottky barrier diode capable of operating at a high speed as the free wheel diode.

Also, with an FET using an SiC semiconductor, which is a wide band-gap semiconductor, when the body diode is energized, it is anticipated that a bipolar action by the body diode promotes crystalline degradation in the SiC semiconductor. To avoid such an inconvenience, a free wheel diode having an ON voltage lower than an energization starting voltage of the body diode is used as described, for example, in Patent Document 1.

Patent Document 1: JP-A-2007-305836

The power converter in the related art, however, uses an FET that can be energized in two ways (directions from drain to source and from source to drain). Hence, while the FET is in an ON state, a current hardly flows through the free wheel diode and the current flows through the FET having a lower ON voltage than the free wheel diode.

Accordingly, during complementary switching actions of the FETs in the two series-connected semiconductor switches, a current flows through the FETs in periods other than a dead time. The FETs therefore generate heat and temperatures of the FETs rise in comparison with the free wheel diodes. Hence, there arises a problem that the temperatures of the FETs limit maximum output power of the power converter.

SUMMARY OF THE INVENTION

The invention is devised to solve the problems discussed above and has an object to provide a power converter achieving higher maximum output power by suppressing heat generation in FETs of the power converter.

A power converter according to an aspect of the invention includes: one set of two semiconductor switches performing switching actions, each of which is formed of an FET and a free wheel diode connected in anti-parallel to the FET and only one of which is energized to convert power by the switching actions; a smoothing capacitor; a portion that detects a direction of a current flowing through the semiconductor switches; and a control portion that makes PWM gate signals of the semiconductor switches into gate signals in which ON signals are skipped either partially or entirely relative to complementary gate signals when the direction of the current flowing through the semiconductor switches is negative.

When configured in this manner, by skipping ON signals of the PWM gate signals when the direction of the current flowing through the semiconductor switches is negative, a period in which the current flows through the FETs becomes shorter and conversely a period in which the current flows through the free wheel diodes becomes longer. Accordingly, although heat generation in the freewheel diodes is increased, heat generation in the FETs can be reduced and hence temperatures of the FETs can be lowered. It thus becomes possible to increase maximum output power of the power converter.

The foregoing and other objects, features, aspects, and advantages of the present invention will become more apparent from the following detailed description of the present invention when taken in conjunction with the accompanying drawings.

DETAILED DESCRIPTION OF THE INVENTION

Hereinafter, preferred embodiments of a power converter of the invention will be described with reference to the drawings.

First Embodiment

Figure 1:
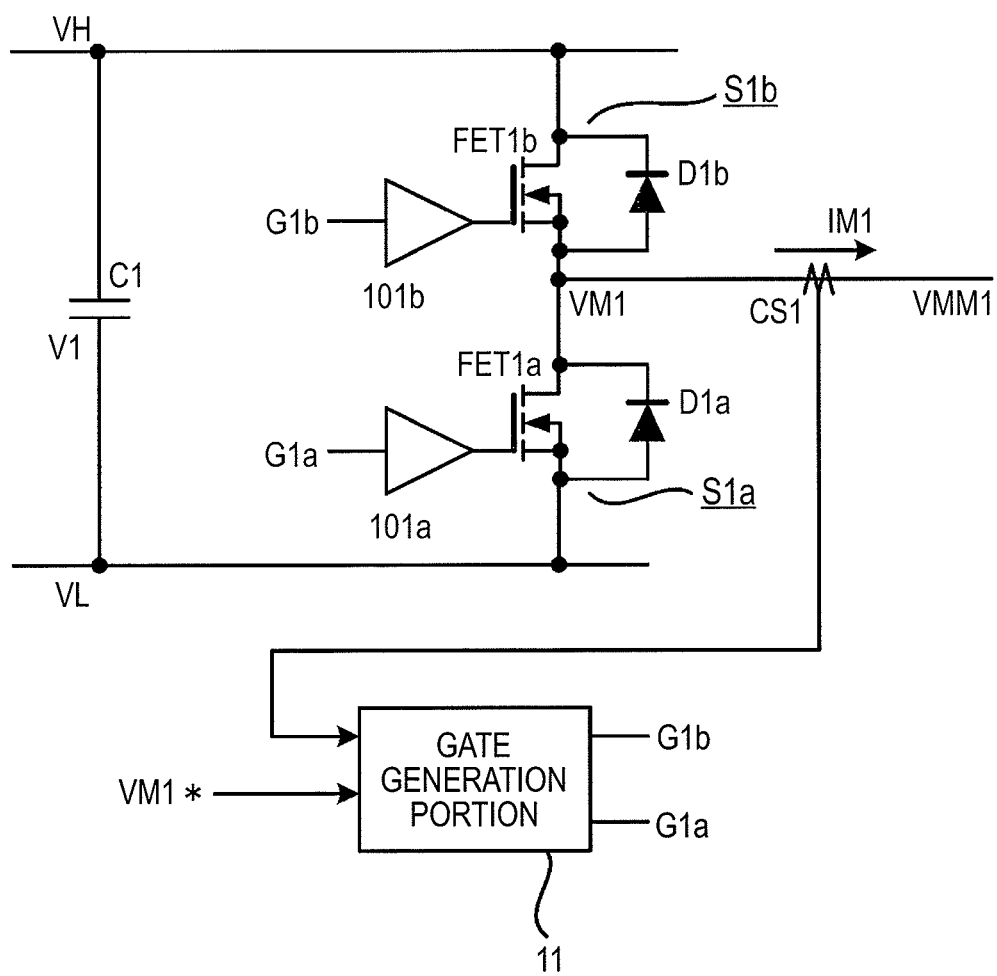
FIG. 1 is an electric circuit diagram showing a configuration of a power converter according to a first embodiment of the invention.

FIG. 1 is an electric circuit diagram showing a configuration of a main circuit and a control portion of a power converter according to a first embodiment of the invention.

A power converter 10 of the first embodiment is a voltage-sourced power converter furnished with a capability of converting a DC voltage V1 between a voltage terminal VH and a voltage terminal VL to a square-wave voltage by complementary switching actions of one set of semiconductor switches S1a and S1b and outputting the resulting voltage to a voltage terminal VM1.

Referring to FIG. 1, the power converter 10 includes a smoothing capacitor C1 that smoothes the DC voltage V1, one set of the semiconductor switches S1a and S1b, a current sensor CS1 as a portion detecting a current flowing through the semiconductor switches S1a and S1b, and a gate generation portion 11.

The semiconductor switches S1a and S1b in one set are formed of FET1a and FET1b, which are FETs using a wide band-gap semiconductor (hereinafter, referred to simply as the FET1a and the FET1b for ease of description), and free wheel diodes D1a and D1b connected in anti-parallel to the FET1a and the FET1b, respectively. The FET1a and FET1b each have a source terminal, a drain terminal, and a gate terminal. The free wheel diodes D1a and D1b each have an anode terminal and a cathode terminal and are formed of a Schottky barrier diode.

The anode terminal of the diode D1a is connected to the source terminal of the FET1a and the cathode terminal of the diode D1a is connected to the drain terminal of the FET1a. Also, the anode terminal of the diode D1b is connected to the source terminal of the FET1b and the cathode terminal of the diode D1b is connected to the drain terminal of the FET1b.

Connections in the power converter 10 will now be described in detail.

In the FET1a forming the semiconductor switch S1a, the source terminal is connected to the low voltage side terminal VL of the smoothing capacitor C1 and the drain terminal is connected to the voltage terminal VM1. Also, in the FET1b forming the semiconductor switch Sib, the source terminal is connected to the voltage terminal VM1 and the drain terminal is connected to the high voltage side terminal VH of the smoothing capacitor C1. The semiconductor switches S1a and S1b and the smoothing capacitor C1 functioning as a voltage source together form the voltage-sourced power converter 10.

A voltage terminal VMM1 is connected to the voltage terminal VM1 and the current sensor CS1 is connected between the voltage terminals VM1 and VMM1. The current sensor CS1 is a current sensor that detects a current flowing in a direction from the voltage terminal VM1 to the voltage terminal VMM1 as a current flowing in a positive direction.

Only one of the semiconductor switches S1a and S1b is brought into conduction by switching actions. Accordingly, while the semiconductor switch S1b is in conduction, a current flowing through the semiconductor switch S1b is equal to a detection current in the current sensor CS1. Likewise, while the semiconductor switch S1a is in conduction, a current flowing through the semiconductor switch S1a is equal to the detection current in the current sensor CS1 albeit in a reversed polarity.

When a current in the current sensor CS1 is positive, a current flows through the semiconductor switch S1a in a negative direction while it is in conduction, whereas a current flows through the semiconductor switch S1b in a positive direction while it is in conduction. Likewise, when a current in the current sensor CS1 is negative, a current flows through the semiconductor switch S1a in a positive direction when it is energized, whereas a current flows through the semiconductor switch S1b in a negative direction when it is energized. In other words, the current sensor CS1 serves to detect not only a current between the voltage terminals VM1 and VMM1 but also a current flowing through the semiconductor switches S1a and S1b.

The gate terminal of the FET1a forming the semiconductor switch S1a is connected to an output terminal of a gate drive circuit 101a and a gate signal G1a is inputted into an input terminal of the gate drive circuit 101a. The gate terminal of the FET1b forming the semiconductor switch S1b is connected to an output terminal of a gate drive circuit 101b and a gate signal G1b is inputted into an input terminal of the gate drive circuit 101b.

A detection current IM1 in the current sensor CS1 is inputted into the gate generation portion 11 and the gate signals G1b and G1b are outputted from the gate generation portion 11. The gate signals G1a and G1b are connected to the semiconductor switches S1a and S1b via the gate drive circuits 101a and 101b, respectively. The FET1a and FET1b respectively forming the semiconductor switches S1a and S1b switch ON when the gate signals G1a and G1b are high signals (ON signals) and switch OFF when the gate signals G1a and G1b are low signals (OFF signals), respectively.

Figure 2:
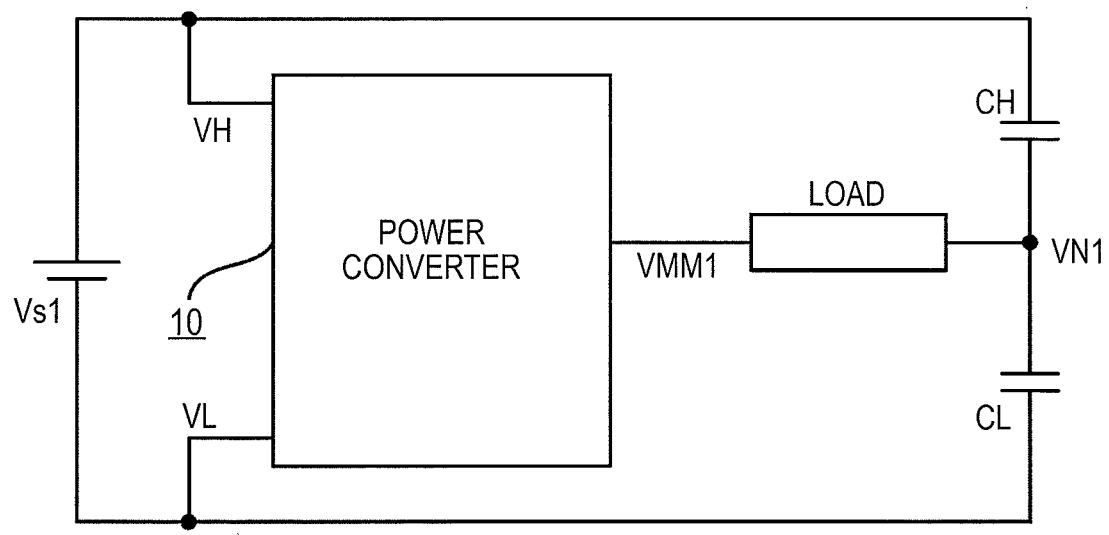
FIG. 2 is a circuit diagram showing a configuration of a half-bridge inverter using the power converter according to the first embodiment of the invention.

FIG. 2 is an overall view schematically showing connections of the power converter 10 to a power supply and a load to form a half-bridge inverter.

Referring to FIG. 2, a high voltage side terminal of a capacitor CH is connected to the high voltage side terminal VH of the capacitor C1 and a low voltage side terminal of a capacitor CL is connected to the low voltage side terminal VL of the capacitor C1. A low voltage side terminal of the capacitor CH and a high voltage side terminal of the capacitor CL are connected to a voltage terminal VN1. The capacitors CH and CL are smoothing capacitors that divide the voltage V1 of the capacitor C1 to smooth the voltage V1.

A battery Vs1 functioning as a voltage source is connected between the voltage terminals VH and VL of the power converter 10. An AC inductive load Load is connected between the voltage terminals VMM1 and the VN1. This half-bride inverter performs an inverter operation to output the DC voltage V1 inputted between the voltage terminals VH and VL to the load Load and a rectification operation to output energy accumulated in the load Load between the voltage terminals VH and VL. The inverter operation and the rectification operation are adjusted by voltage and current phases of the load Load.

Figure 3:
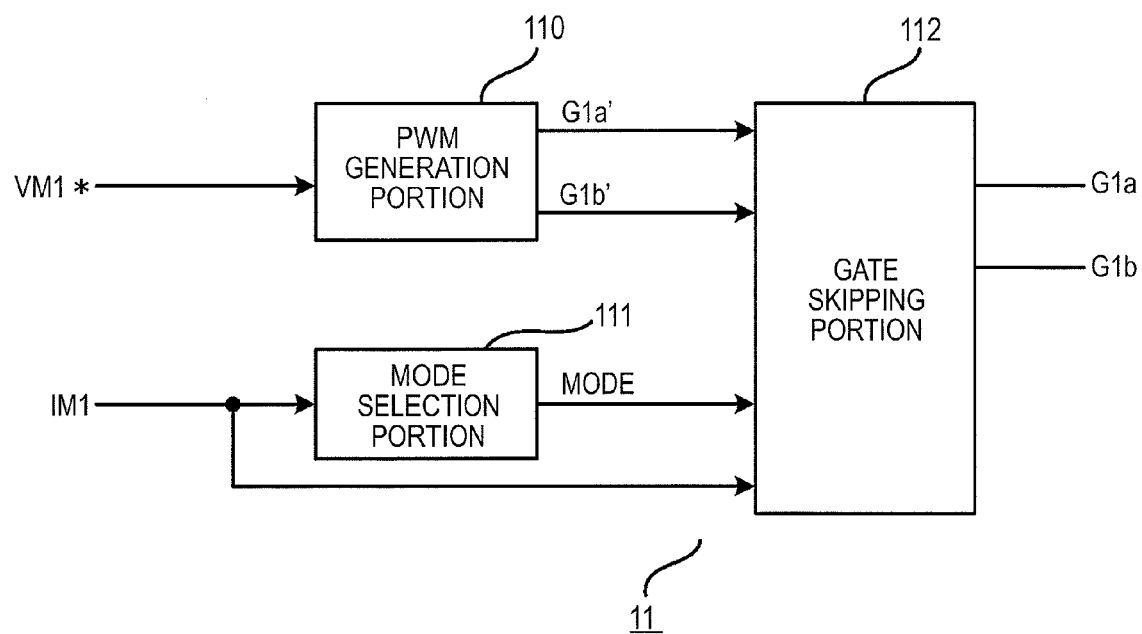
FIG. 3 is a block diagram showing a control portion of the power converter according to the first embodiment of the invention.

FIG. 3 is a block diagram showing a configuration of the gate generation portion 11, which is the control portion of the power converter 10. The gate generation portion 11 includes a PWM generation portion 110, a mode selection portion 111, and a gate skipping portion 112.

The PWM generation portion 110 receives an input of a voltage command VM1* to the voltage terminal VM1 and outputs complementary gate signals G1a' and G1b'. The mode selection portion 111 receives an input of the detection current IM1 in the current sensor CS1 and outputs a mode signal Mode. The gate skipping portion 112 receives inputs of the complementary gate signals G1a' and G1b', the mode signal Mode, and the detection current IM1 and outputs the gate signals G1a and G1b.

The mode selection portion 111 calculates an effective value of the current IM1. In a case where the effective value of the current IM1 is large at a value equal to or greater than a predetermined threshold IM1th, the mode selection portion 111 outputs a mode signal Mode exhibiting a skipping switching mode (a switching mode in which ON signals of PWM gate signals are skipped either partially or entirely relative to the complementary gate signals when the current is negative). In a case where the effective value of the threshold IM1 is small at a value less than the threshold IM1th, the mode selection portion 111 outputs a mode signal Mode exhibiting a complementary switching mode. The threshold IM1th is a threshold on the basis of which the skipping switching mode or the complementary switching mode is selected.

The PWM generation portion 110 outputs the complementary gate signals G1a' and G1b' according to the voltage command VM1*. The complementary gate signals G1a' and G1b' are signals behaving complementarily to each other. In periods other than a dead time set to prevent a short circuit of the semiconductor switches S1a and S1b, the gate signal G1b' becomes an OFF signal when the gate signal G1a' is an ON signal and the gate signal G1b' becomes an ON signal when the gate signal G1a' is an OFF signal.

The dead time is a period during which both of the gate signals G1a' and G1b' become OFF signals at the time of transition of the gate signals G1a' and G1b' and is sufficiently short in comparison with a switching cycle. The dead time is a period to prevent a short circuit of the semiconductor switches S1a and S1b at the time of switching transition.

The gate skipping portion 112 determines the gate signals G1a and G1b on the basis of the mode signal Mode, the complementary gate signals G1a' and G1b', and the current IM1.

When the mode signal Mode exhibits the complementary switching mode, the gate skipping portion 112 outputs the gate signals G1a and G1b by determining as: gate signal G1a=gate signal G1a' and gate signal G1b=gate signal G1b'. When the mode signal Mode exhibits the skipping switching mode, the gate skipping portion 112 outputs, as the gate signals G1a and G1b, signals in which ON signals are skipped either partially or entirely relative to the gate signals G1a' and G1b' when the current flowing through the semiconductor switches S1a and S1b is negative.

Under circumstances where the mode signal Mode exhibits the skipping switching mode, the current flowing through the semiconductor switch S1a is negative, and the current IM1 is greater than a threshold Ip (threshold equal to or greater than 0), the gate skipping portion 112 determines as: gate signal G1a=low signal (OFF signal) and gate signal G1b=gate signal G1b', and outputs the gate signals G1a and G1b while skipping ON signals of the gate signal G1a.

Under circumstances where the mode signal Mode exhibits the skipping switching mode, the current flowing through the semiconductor switch S1b is negative, and the current IM1 is less than a threshold −Ip (a threshold equal to or less than 0), the gate skipping portion 112 determines as: gate signal G1a=gate signal G1a' and the gate signal G1b=low signal (OFF signal), and outputs the gate signals G1a and G1b while skipping ON signals of the gate signal G1b. Also, under circumstances where the mode signal Mode exhibits the skipping switching mode and the current IM1 is greater than the threshold −Ip and less than the threshold Ip, the gate skipping portion 112 determines as: gate signal G1a=gate signal G1a' and gate signal G1b=gate signal G1b', and outputs the gate signals G1a and G1b.

The threshold Ip used in the gate skipping portion 112 is a threshold on the basis of which a gate signal skipping period (ratio) in the skipping switching mode is determined.

The PWM generation portion 110, the mode selection portion 111, and the gate skipping portion 112 may be achieved by a micro-computer or electronic circuits.

Figure 4:
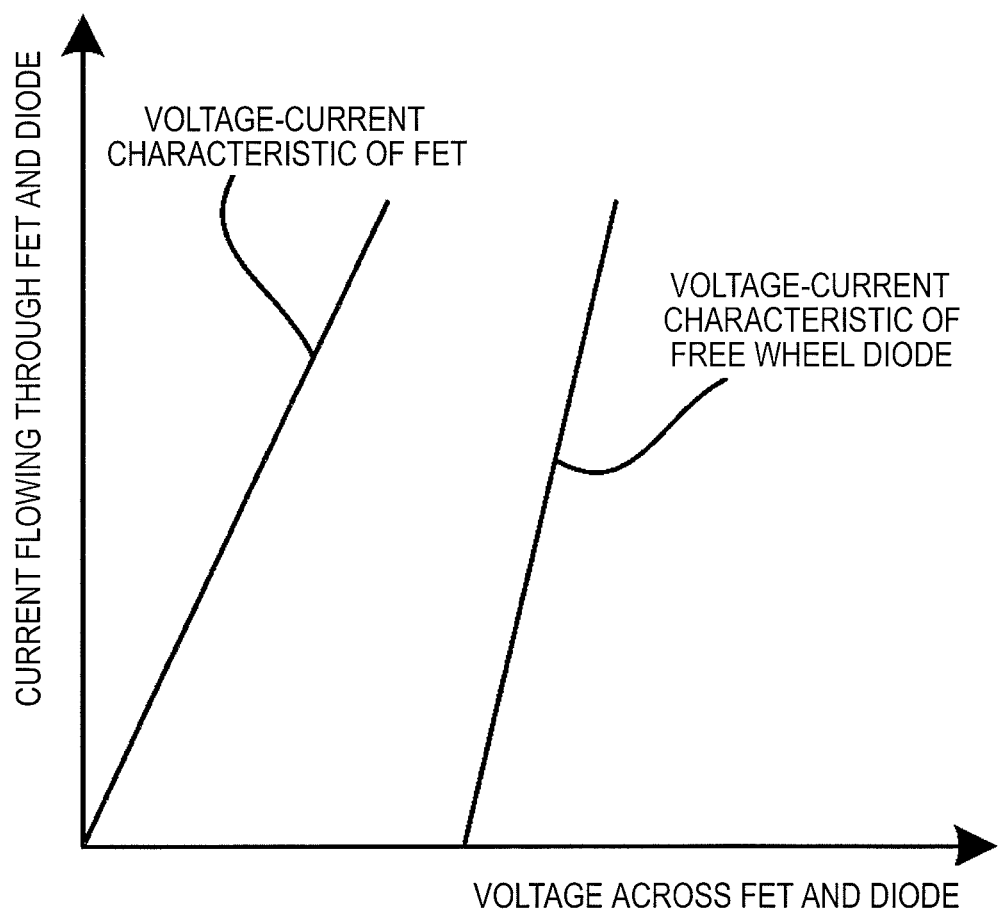
FIG. 4 is a voltage-current characteristic chart of an FET and a voltage-current characteristic chart of a free wheel diode according to the first embodiment of the invention.

FIG. 4 shows a voltage-current characteristic chart of an FET and a voltage-current characteristic chart of a free wheel diode. The ordinate of FIG. 4 is used for a current flowing through the FET (a current flowing from source to drain) in an ON state and a current flowing through the free wheel diode (a current flowing from anode to cathode). The abscissa of FIG. 4 is used for a voltage drop across the FET (a voltage drop between source and drain) in an ON state and a voltage drop across the free wheel diode (a voltage drop between anode and cathode). A voltage drop across the FET is small in comparison with a voltage drop across the free wheel diode.

Figure 5A:
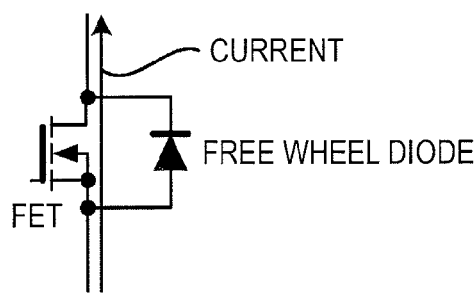
FIGS. 5A and 5B are views showing a current flowing through a semiconductor switch according to the first embodiment of the invention.
Figure 5B:
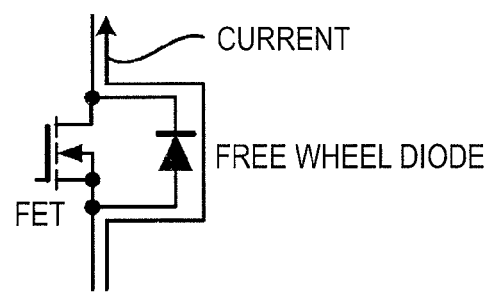

FIGS. 5A and 5B are views showing a current flowing through a semiconductor switch in a case where the current flows through the semiconductor switch in the negative direction. Referring to FIG. 5A, the FET is in an ON state and the current flows through the FET having a small voltage drop in comparison with the free wheel diode. Referring to FIG. 5B, the FET is in an OFF state and the current flows through the free wheel diode. Accordingly, in a case where the FET is in an ON state while the current is flowing through the semiconductor switch in the negative direction, the current hardly flows through the free wheel diode and the current flows through the FET.

Figure 6:
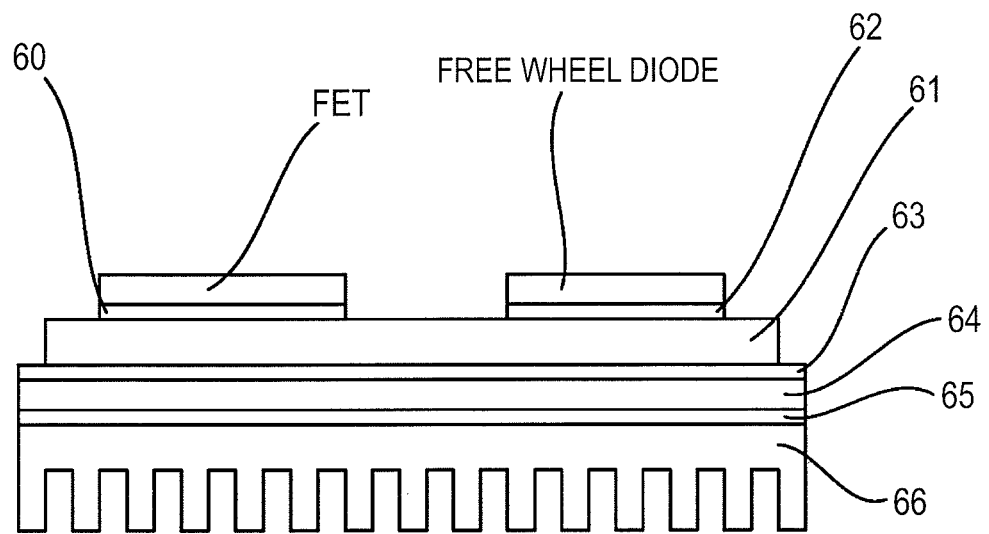
FIG. 6 is a view showing a configuration of an FET and a free wheel diode forming the semiconductor switch according to the first embodiment of the invention.

FIG. 6 is a view showing a configuration of the FET and the free wheel diode. A drain potential surface of the FET is connected to one surface of a plate-shaped heat spreader 61 via a solder 60. A cathode potential surface of the free wheel diode is connected to the same surface of the heat spreader 61 via a solder 62. The other surface of the heat spreader 61 is connected to one surface of copper foil 64 via an insulating sheet 63. The other surface of the copper foil 64 is connected to a heat sink 66 via grease 65.

A loss (heat generation) occurring in the FET is transmitted in order of the solder 60, the heat spreader 61, the insulating sheet 63, the copper foil 64, and the grease 65 and transmitted heat is cooled in the heat sink 66. A loss (heat generation) occurring in the free wheel diode is transmitted in order of the solder 62, the heat spreader 61, the insulating sheet 63, the copper foil 64, and the grease 65 and the transmitted heat is cooled in the heat sink 66. Accordingly, although the FET and the free wheel diode thermally interfere with each other, an influence thereof is negligibly small. Just for comparison, when the semiconductor switch is formed by connecting the free wheel diode to a source potential surface of the FET via a solder, thermal interference becomes noticeable.

An operation of the power converter 10 of the first embodiment will now be described with reference to FIG. 7 and FIG. 8.

Figure 7:
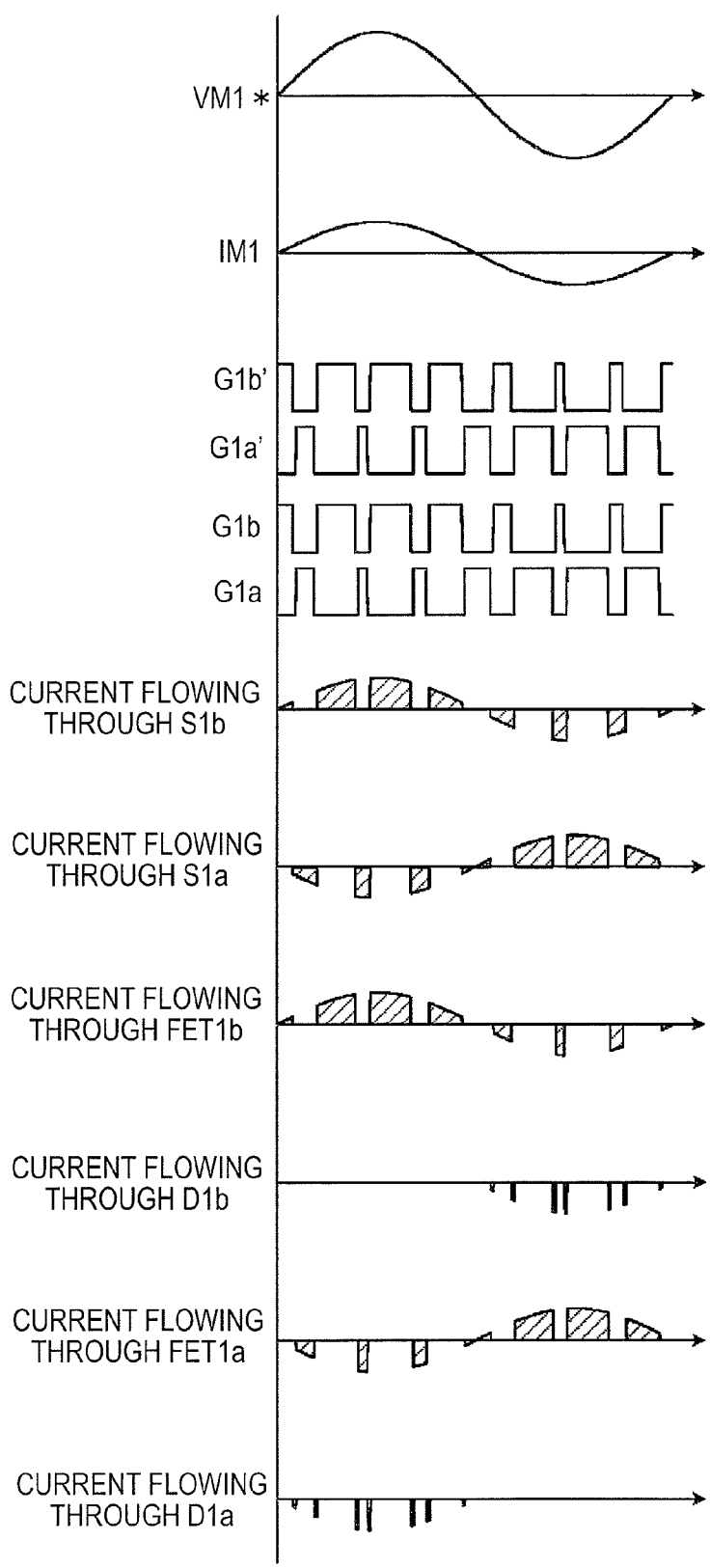
FIG. 7 is a waveform chart showing an operation in a complementary switching mode by the power converter according to the first embodiment of the invention.

FIG. 7 is an operation waveform chart in the complementary switching mode. More specifically, FIG. 7 is an operation waveform chart when the effective value of the current IM1 is small at a value less than the threshold IM1th. FIG. 8 is an operation waveform chart in the skipping switching mode. More specifically, FIG. 8 shows an operation waveform chart when the effective value of the current IM1 is large at a value equal to or greater than the threshold IM1th.

Figure 8:
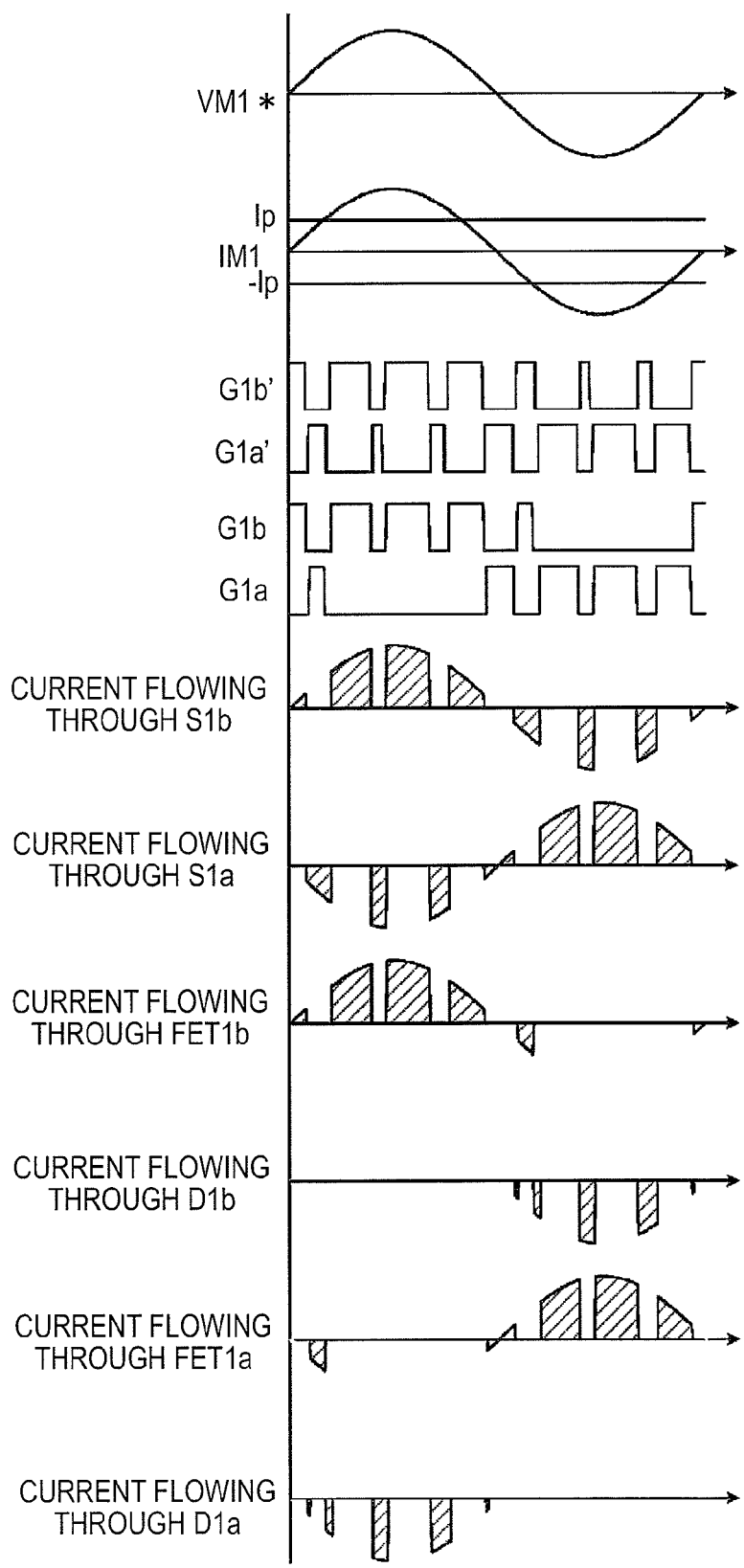
FIG. 8 is a waveform chart showing an operation in a skipping switching mode by the power converter according to the first embodiment of the invention.

FIG. 7 and FIG. 8 show the following factors for one cycle of current along the same time axis: the voltage command VM1*, the current IM1, the gate signals G1$a'$, G1$b'$, G1$a$, and G1$b$, currents flowing through the semiconductor switches S1$a$ and S1$b$, currents flowing through the FET1$a$ and the FE1$b$, and currents flowing through the free wheel diodes D1$a$ and D1$b$. FIG. 7 and FIG. 8 show only one cycle of current. It should be appreciated, however, that the power converter 10 operates in a series of cycles in practice.

Firstly, an operation in the complementary switching mode (an operation when the effective value of the current IM1 is small at a value less than the threshold IM1th) will be described in the following with reference to FIG. 7.

The PWM generation portion 110 outputs the complementary PWM signals G1$a'$ and G1$b'$ according to the sinusoidal voltage command VM1* inputted therein.

Because the effective value of the current IM1 is small at a value less than the threshold IM1th, the mode selection portion 111 outputs a mode signal Mode exhibiting the complementary switching mode and the mode signal Mode exhibiting the complementary switching mode is inputted into the gate skipping portion 112. The gate skipping portion 112 therefore determines the gate signals G1$a$ and G1$b$ as: G1$a$=G1$a'$ and G1$b$=G1$b'$ and outputs signals that behave complementarily in periods other than the dead time.

Herein, because a voltage drop across the FET is small in comparison with the free wheel diode, a current flows through the FET independently of whether the current is negative or positive while the FET in the semiconductor switch is in an ON state.

Hence, when the gate signal G1$a$ is an ON signal, the FET1$a$ in the semiconductor switch S1$a$ is brought into conduction and when the gate signal G1$b$ is an ON signal, the FET1$b$ in the semiconductor switch S1$b$ is brought into conduction. Also, when both of the gate signals G1$a$ and G1$b$ are OFF signals (dead time), the free wheel diode Da1 is brought into conduction when the current IM1 is positive and the free wheel diode D1$b$ is brought into conduction when the current IM1 is negative.

The FET having a small voltage drop in comparison with the free wheel diode is brought into conduction in periods other than the dead time. In other words, it becomes possible to achieve a power converter having a small conduction loss and high power conversion efficiency. A conduction loss (heat generation) in the FET is large in comparison with the free wheel diode. However, because the current is small, a temperature of the FET does not exceed a usable upper limit temperature. In this manner, the complementary switching is performed when the current is small. It thus becomes possible to achieve a power converter with a small conduction loss (high power conversion efficiency).

An operation in the skipping switching mode (an operation when the effective value of the current IM1 is large at a value equal to or greater than the threshold IM1th) will now be described with the reference to FIG. 8.

As in the complementary switching mode, the PWM generation portion 110 outputs the complementary PWM signals G1$a'$ and G1$b'$ according to the sinusoidal voltage command VM1* inputted therein.

Because the effective value of the current IM1 is large at a value equal to or greater than the threshold IM1th, the mode selection portion 111 outputs a mode signal Mode exhibiting the skipping switching mode and the mode signal Mode exhibiting the skipping switching mode is inputted into the gate skipping portion 112. Accordingly, the gate signals G1$a$ and G1$b$ become skipped gate signals in which ON signals are skipped relative to the gate signals G1$a'$ and G1$b'$ when the current flowing through the semiconductor switches S1$a$ and S1$b$ is negative.

When the current IM1 is positive, the current flows through the semiconductor switch S1$a$ in the negative direction while it is energized and the current flows through the semiconductor switch S1$b$ in the positive direction while it is energized.

When the current IM1 is positive (when a flowing current of the semiconductor switch S1$a$ is negative) and the current IM1 is equal to or greater than the threshold Ip (threshold equal to or greater than 0), ON signals of the gate signal G1$a$ are skipped and the gate signal G1$a$ becomes an OFF signal. In this instance, the current flowing through the semiconductor switch S1$a$ does not flow through the FET1$a$ and flows through the free wheel diode D1$a$. When the current IM1 is positive and less than the threshold Ip, the gate signals G1$b$ and G1$b$ are complementary signals and the current flowing through the semiconductor switch S1$a$ flows through the FET1$a$ in periods other than the dead time. Hence, by adjusting the value of the threshold Ip, it becomes possible to change a time ratio of energization between the FET1$a$ and the free wheel diode Da1.

Likewise, when the current IM1 is negative (when a flowing current of the semiconductor switch S1$b$ is negative) and the current IM1 is small at a value less than the threshold −Ip (threshold equal to or less than 0), ON signals of the gate signal G1$b$ are skipped and the gate signal G1$b$ becomes an OFF signal. In this instance, the current flowing through the semiconductor S1$b$ does not flow through the FET1$b$ and flows through the free wheel diode D1$b$. Also, when the current IM1 is negative and equal to or greater than the threshold −Ip, the gate signals G1$a$ and G1$b$ are complementary signals and the current flowing through the semiconductor switch S1$b$ flows through the FET1$b$ in periods other than the dead time. Hence, by adjusting the value of the threshold −Ip, it becomes possible to change a time ratio of energization between the FET1$b$ and the free wheel diode D1$b$.

While it has been described on the assumption that the threshold Ip is a fixed value, it should be appreciated that the threshold Ip may be changed in response to the effective value of the current IM1. Even in the same skipping switching mode, a larger current flows through the FET and the FET readily becomes hot as the effective value of the current IM1 becomes larger. Accordingly, it is effective to set the threshold Ip small particularly when the effective value of the current IM1 is large because an energization time of the FET becomes shorter.

Alternatively, a temperature sensor to measure a temperature of the FET may be provided so that the threshold Ip is changed in response to the temperature of the FET. For example, when the FET1$a$ becomes hot at a temperature as high as or above a predetermined temperature, an energization time of the FET1$a$ becomes shorter by setting the threshold Ip smaller. Accordingly, heat generation in the FET1$a$ is reduced and it becomes possible to lower the temperature of the FET1$a$.

As has been described, in a case where the current IM1 is large, the skipping switching is performed when the flowing current of the semiconductor switches S1$a$ and S1$b$ is negative. Hence, energization times of the FET1$a$ and the FET1$b$ can be shorter and heat generation in the FET1$a$ and the FET1$b$ is reduced. The temperatures of the FET1$a$ and the FET1$b$ can be therefore lowered. It thus becomes possible to increase a flowing current of the power converter that is otherwise limited by the temperatures of the FETs. Consequently, maximum output power can be increased.

In the skipping switching mode, the energization times of the free wheel diodes D1$a$ and D1$b$ become longer and heat generation in the free wheel diodes D1$a$ and D1$b$ is increased. However, because thermal interference between the FET1$a$ and the FET1*b* and the free wheel diodes D1*a* and D1*b* is so small that a temperature rise of the FET1*a* and the FET1*b* caused by heat generation in the free wheel diodes D1*a* and D1*b* is too small to cause any problem.

For example, given that a modulation factor is 1 (the amplitude of VM1* is given by 0.5×V1) and a power factor of the load is 0.6, then, by performing the skipping switching mode when the current flowing through the semiconductor switches S1*a* and S1*b* is negative, heat generation in the FET1*a* and the FET1*b* is reduced by about 30% relative to the complementary switching and a temperature rise of the FET1*a* and the FET1*b* is also reduced by about 30%. Hence, by performing the skipping switching, it becomes possible to increase a flowing current by 10 to 20% and hence to increase maximum output power by 10 to 20%.

As has been described above, the power converter of the first embodiment is a voltage-sourced power converter having two (one set of) semiconductor switches, each of which is formed of an FET and a free wheel diode connected in antiparallel to the FET, and formed by connecting the two (one set of) semiconductor switches to a capacitor functioning as a voltage source. The power converter is provided with a current sensor CS1 that detects a direction of a current flowing through the semiconductor switches. The power conversion efficiency can be increased by setting the complementary switching mode (by performing complementary switching) when magnitude of the current flowing through the semiconductor switches is small at a value less than a predetermined threshold. Maximum output power of the power converter can be increased by setting the skipping switching mode (by performing switching while skipping ON signals of the PWM gate signals either partially or entirely relative to the complementary gate signals when the current is negative) when magnitude of the current flowing through the semiconductor switches is large at a value equal to or greater than the predetermined threshold.

While the first embodiment has been described on the assumption that the threshold IM1th is fixed, a temperature sensor to detect a temperature of the FET may be provided while making the threshold IM1th variable in response to the temperature of the FET, so that the threshold IM1th is set small when the FET is hot at a temperature as high as or above a predetermined temperature and the threshold IM1th is set large when the FET is cold at a temperature below the predetermined temperature. When configured in this manner, it becomes possible to set the complementary switching mode as much as possible when the temperature of the FET is low and there is a margin and to set the skipping switching mode when the temperature of the FET is high and there is little margin.

Also, the same advantage can be obtained by configuring in such a manner that the complementary switching mode is set when the FET is cold at a temperature below a predetermined temperature and the skipping switching mode is set when the FET is hot at a temperature as high as or above the predetermined temperature instead of switching the complementary switching mode and the skipping switching mode according to the current threshold IM1th.

Also, the temperature sensor detecting the temperature of the FET may be replaced with a temperature sensor that detects a temperature of a heat sink that cools the FET and the free wheel diode or a temperature sensor that detects a temperature of a refrigerant in the heat sink.

In the first embodiment, the current sensor CS1 is used to detect the current flowing through the semiconductor switches S1*a* and S1*b*. However, a current sensor connected in series to the semiconductor switches S1*a* and S1*b* may be used instead. Also, the direction of a current flowing through the semiconductor switches S1*a* and S1*b* is detected by the current sensor CS1 herein. However, a direction of the current flowing through the semiconductor switches may be discriminated by measuring potential at the voltage terminal VM1 in the dead time.

A relation between the potential at the voltage terminal VM1 and a direction of the current flowing through the semiconductor switch will now be described. When the potential at the voltage terminal VM1 is substantially equal to potential at the voltage terminal VH in the dead time, the diode D1*b* in the semiconductor switch S1*b* is in conduction. Hence, a negative current is flowing through the semiconductor switch S1*b*. Likewise, when the potential at the voltage terminal VM1 is substantially equal to potential at the voltage terminal VL in the dead time, the diode D1*a* in the semiconductor switch S1*a* is in conduction. Hence, a negative current is flowing through the semiconductor switch S1*a*.

In the first embodiment, there are two modes: the complementary switching mode and the skipping switching mode. It should be appreciated, however, that there may be the skipping switching mode alone. In such a case, although the power conversion efficiency is lowered because the skipping switching mode is set even when the magnitude of the current is small, it becomes possible to increase a maximum output as in the first embodiment.

The first embodiment has been described using a voltage-sourced half-bridge inverter using one power converter 10. It should be appreciated, however, that the same advantage can be achieved even with a voltage-sourced three-phase inverter using three power converters 10 or a voltage-sourced DC-to-DC converter using one power converter 10, a reactor, and a capacitor.

Figure 9:
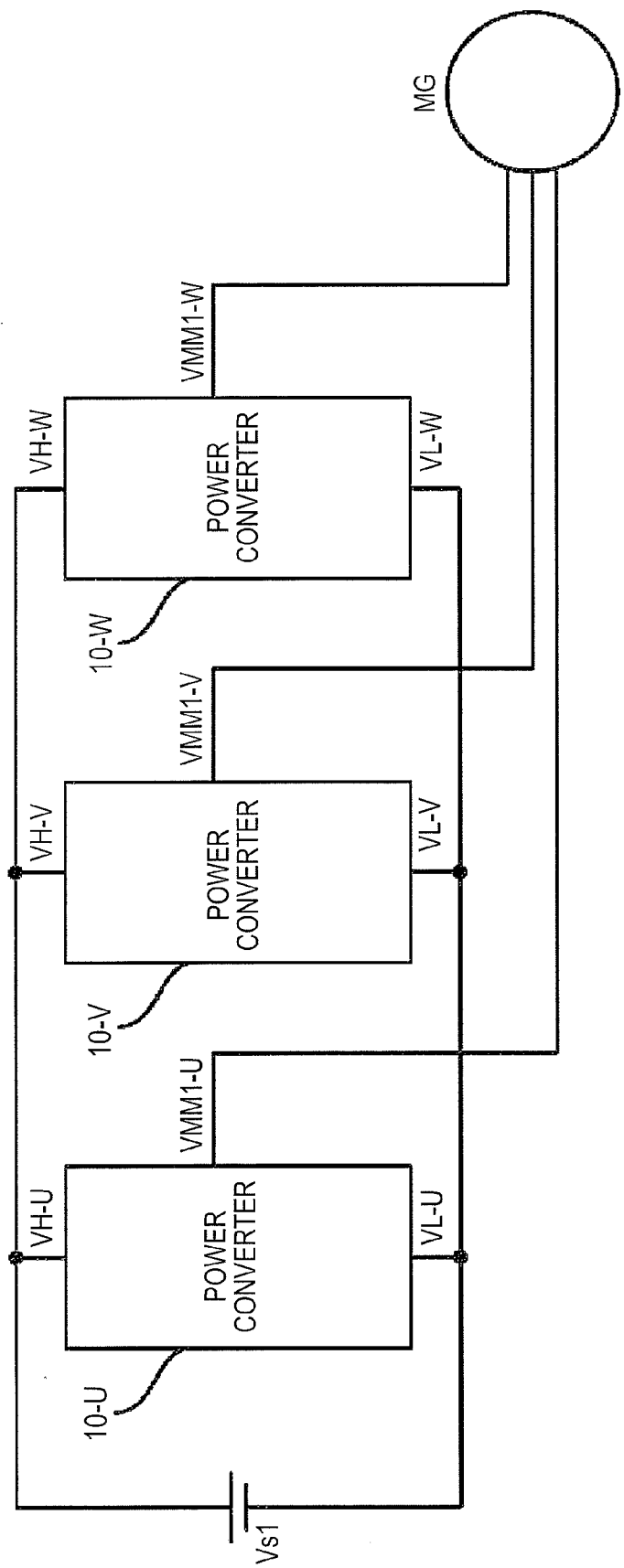
FIG. 9 is an electric circuit diagram showing a configuration of a three-phase inverter using the power converter according to the first embodiment of the invention.

FIG. 9 is an electric circuit diagram showing a configuration of a voltage-sourced three-phase inverter using three power converters 10, a battery Vs1, and a motor generator MG. The respective three power converters 10 are referred to as 10-U, 10-V, and 10-W for identification. The voltage terminals VH of the power converters 10-U, 10-V, and 10-W are referred to as voltage terminals VH-U, VH-V, and VH-W, respectively. Likewise, the voltage terminals VL of the power converters 10-U, 10-V, and 10-W are referred to as voltage terminals VL-U, VL-V, and VL-W, respectively. Also, the voltage terminals VMM1 of the power converters 10-U, 10-V, and 10-W are referred to as voltage terminals VMM1-U, VMM1-V, and VMM1-W, respectively.

The voltage terminals VL-U, VL-V, and VL-W are interconnected and the connection points are connected to a low voltage side of the battery Vs1. The voltage terminals VH-U, VH-V, and VH-W are interconnected and the connection points are connected to a high voltage side of the battery Vs1. Also, the voltage terminals VMM1-U, VMM1-V, and VMM1-W are connected to the three-phase motor generator MG. The power converters 10-U, 10-V, and 10-W may use a common capacitor C1 and the gate generation portions 11 for the respective power converter 10-U, 10-V, and 10-W may be combined into one unit.

In the case of a three-phase inverter, a sum of the currents in the current sensors CS1 of the respective power converters 10-U, 10-V, and 10-W is 0. Accordingly, it may be configured in such a manner that the current sensor CS1 is provided only to the power converters 10-U and 10-V and a current in the power converter 10-W is found by computation.

Figure 10:
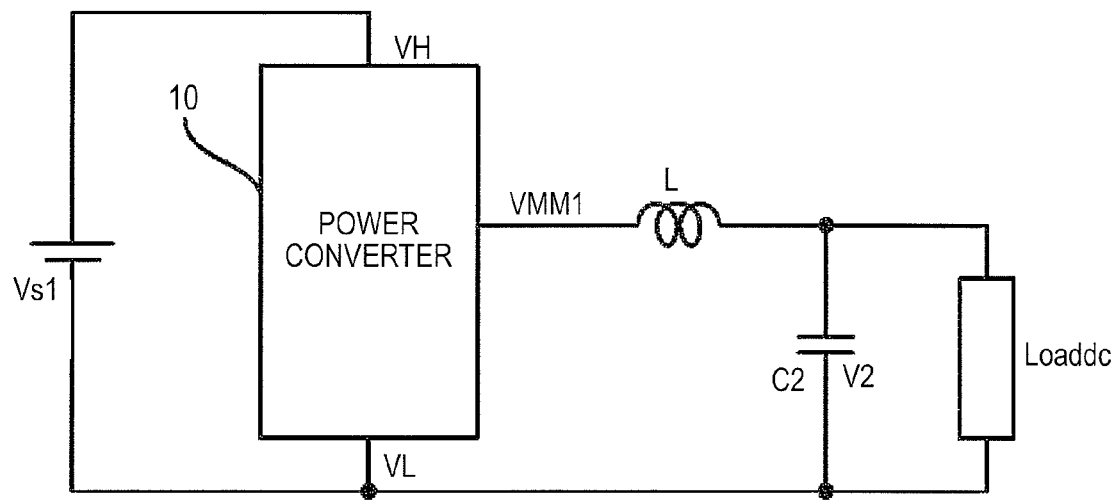
FIG. 10 is an electric circuit diagram of an DC-to-DC converter using the power converter according to the first embodiment of the invention.

FIG. 10 is a circuit diagram of a DC-to-DC converter using the power converter 10. One terminal of a reactor L is connected to the voltage terminal VMM1 and the other terminal of the reactor L is connected to a high voltage side terminal of a smoothing capacitor C2. A low voltage side terminal of the capacitor C2 is connected to the voltage terminal VL. Also, a battery Vs1 is connected to the voltage terminals VH and VL and a DC load Loaddc is connected to a high voltage side terminal and a low voltage side terminal of the capacitor C2. This is a step-down DC-to-DC converter that steps down the battery Vs1 and outputs the resulting voltage to the capacitor C2 as a voltage V2.

While the power converter 10 of the first embodiment has been described, it should be appreciated that an application of the power converter 10 is not limited to a half-bridge inverter and the power convert 10 is also applicable to various types of voltage-sourced inverters, rectifiers, and DC-to-DC converters.

Second Embodiment

Figure 11:
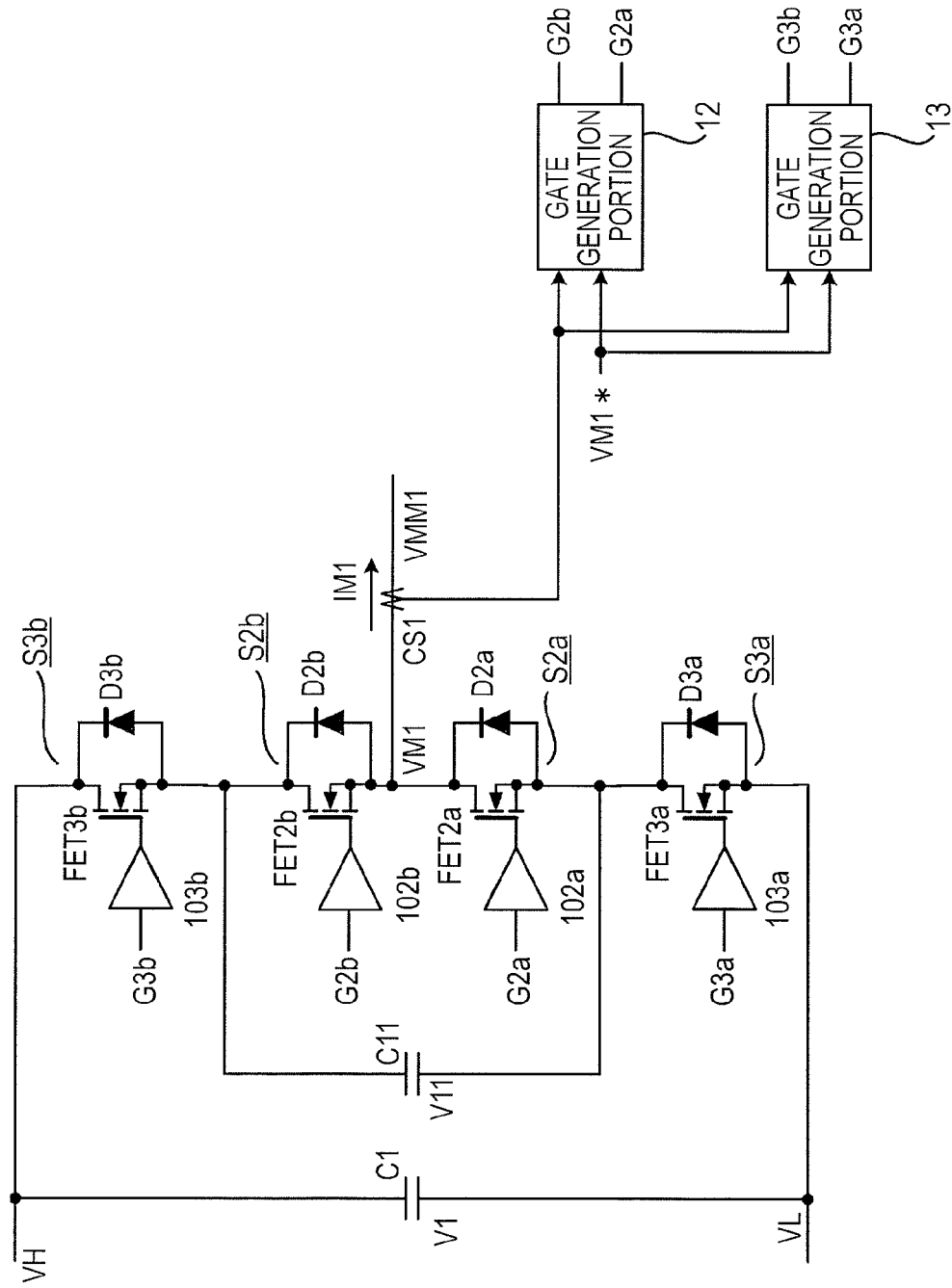
FIG. 11 is an electric circuit diagram showing a configuration of a power converter according to a second embodiment of the invention.

A power converter according to a second embodiment of the invention will now be described. FIG. 11 is an electric circuit diagram showing a configuration of a main circuit and a control portion of the power converter of the second embodiment.

A power converter 20 of the second embodiment is a voltage-sourced power converter furnished with a capability of converting a DC voltage V1 between a voltage terminal VH and a voltage terminal VL to a voltage having three types of potential by switching actions of two sets of semiconductor switches S2a and S2b and semiconductor switches S3a and S3b and outputting the resulting voltage to a voltage terminal VM1. The power converter 10 of the first embodiment above obtains a voltage (square-wave voltage) having two types of potential and outputs the resulting voltage to the voltage terminal VM1. In contrast, the power converter 20 of the second embodiment is a three-level voltage-sourced power converter that obtains a voltage having three types of potential and outputs the resulting voltage to the voltage terminal VM1.

Referring to FIG. 11, the power converter 20 includes a smoothing capacitor C1 that smoothes the DC voltage V1, another smoothing capacitor C11, semiconductor switches S2a and S2b, semiconductor switches S3a and S3b, a current sensor CS1 that detects a current flowing through the semiconductor switches S2a and S2b and the semiconductor switches S3a and S3b, and gate generation portions 12 and 13. The gate generation portions 12 and 13 function in the same manner as the gate generation portion 11 of the first embodiment above, and the gate signals G1a and G1b as outputs of the gate generation portion 11 are changed to gate signals G2a and G2b and gate signals G3a and G3b.

As in the first embodiment above, the semiconductor switches S2a and S2b are formed of FET2a and FET2b using a wide band-gap semiconductor and free wheel diodes D2a and D2b connected in anti-parallel to the FET2a and FET2b, respectively, and the semiconductor switches S3a and S3b are formed of FET3a and FET3b using a wide band-gap semiconductor and free wheel diodes D3a and D3b connected in anti-parallel to the FET3a and FET3b, respectively.

Also, as in the first embodiment above, an anode terminal of the diode D2a is connected to a source terminal of the FET2a and a cathode terminal of the diode D2a is connected to a drain terminal of the FET2a. An anode terminal of the diode D2b is connected to a source terminal of the FET2b and a cathode terminal of the diode D2b is connected to a drain terminal of the FET2b. An anode terminal of the diode D3a is connected to a source terminal of the FET3a and a cathode terminal of the diode D3a is connected to a drain terminal of the FET3a. An anode terminal of the diode D3b is connected to a source terminal of the FET3b and a cathode terminal of the diode D3b is connected to a drain terminal of the FET3b.

Connections in the power converter 20 will now be described in detail.

The source terminal of the FET2a in the semiconductor switch S2a is connected to a low voltage side terminal of the smoothing capacitor C11 and a drain terminal thereof is connected to the voltage terminal VM1. The source terminal of the FET2b in the semiconductor switch S2b is connected to the voltage terminal VM1 and the drain terminal thereof is connected to a high voltage side terminal of the smoothing capacitor C11. The source terminal of the FET3a in the semiconductor switch S3a is connected to a low voltage side terminal VL of the smoothing capacitor C1 and a drain terminal thereof is connected to the low voltage side terminal of the capacitor C11. The source terminal of the FET3b in the semiconductor switch S3b is connected to the high voltage side terminal of the capacitor C11 and a drain terminal thereof is connected to a high voltage side terminal VH of the smoothing capacitor C1.

Only one of the semiconductor switches S2a and S2b is brought into conduction by switching actions. Likewise, only one of the semiconductor switches S3a and S3b is brought into conduction by switching actions. Also, a voltage V11 of the capacitor C11 is half the voltage V1 of the capacitor C1. Hence, while the semiconductor switches S2a and S3a are in conduction, potential at the voltage terminal VH1 is equal to potential at the voltage terminal VL. Also, while the semiconductor switches S2b and S3a are in conduction, the potential at the voltage terminal VM1 is potential obtained by adding the voltage V11 (=V1/2) to the potential at the voltage terminal VL. In short, it is average potential of the potentials at the voltage terminals VL and VH. Also, while the semiconductor switches S2b and S3b are in conduction, potential at the voltage terminal VM1 is equal to potential at the voltage terminal VH. Further, while the semiconductor switches S2a and S3b are in conduction, potential at the voltage terminal VM1 is potential obtained by subtracting the voltage V11 (=V1/2) from the potential at the voltage terminal VH. In short, it is average potential of the potentials at the voltage terminals VL and VH.

In this manner, potential at the voltage terminal VM1 can be three types of potential: potential equal to potential at the voltage terminal VL, potential equal to potential at the voltage terminal VH, and average potential of the potentials at the voltage terminals VL and VH. The semiconductor switches S2a and S2b, the semiconductor switches S3a and S3b, and the smoothing capacitors C1 and C11 functioning as voltage sources together form a three-level voltage-sourced power converter.

As in the first embodiment above, the voltage terminal VMM1 is connected to the voltage terminal VM1 and the current sensor CS1 is connected between the voltage terminals VM1 and VMM1.

Only one of the semiconductor switches S2a and S2b and only one of the semiconductor switches S3a and S3b are brought into conduction by switching actions. Hence, as in the first embodiment above, the current sensor CS1 servers to detect not only a current between the voltage terminals VM1 and VMM1 but also a current flowing through the semiconductor switches S2a and S2b and the semiconductor switches S3a and S3b.

While the semiconductor switch S2b is in conduction, a current flowing through the semiconductor switch S2b is equal to a detection current in the current sensor CS1. Likewise, while the semiconductor switch S2a is in conduction, a current flowing through the semiconductor switch S2a is equal to the detection current in the current sensor CS1 albeit in a reversed polarity. While the semiconductor switch S3b is in conduction, a current flowing through the semiconductor switch S3b is equal to the detection current in the current sensor CS1. While the semiconductor switch S3a is in conduction, a current flowing through the semiconductor switch S3a is equal to the detection current in the current sensor CS1 albeit in a reversed polarity.

A gate terminal of the FET2a in the semiconductor switch S2a is connected to an output terminal of a gate drive circuit 102a and the gate signal G2a is inputted into an input terminal of the gate drive circuit 102a. A gate terminal of the FET2b in the semiconductor switch S2b is connected to an output terminal of a gate drive circuit 102b and the gate signal G2b is inputted into an input terminal of the gate drive circuit 102b. A gate terminal of the FET3a in the semiconductor switch S3a is connected to an output terminal of a gate drive circuit 103a and the gate signal G3a is inputted into an input terminal of the gate drive circuit 103a. A gate terminal of the FET3b in the semiconductor switch S3b is connected to an output terminal of a gate drive circuit 103b and the gate signal G3b is inputted into an input terminal of the gate drive circuit 103b.

A detection current IM1 in the current sensor CS1 is inputted into the gate generation portions 12 and 13 and the gate signals G2a and G2b and the gate signals G3a and G3b are outputted from the gate generation portions 12 and 13, respectively. The gate signals G2a and G2b and the gate signals G3a and G3b are connected to the semiconductor switches S2a and S2b and the semiconductor switches S3a and S3b via the gate drive circuits 102a, 102b, 103a, and 103b, respectively. It should be noted that the main circuit in the power converter 20 is of the same configuration as the configuration disclosed, for example, in Japanese Patent No. 3414749 except for the gate generation portions 12 and 13 serving as the control portion.

The gate generation portions 12 and 13 are the same as the gate generation portion 11 of the first embodiment above and perform the complementary switching when the effective value of the current IM1 is small at a value less than the predetermined threshold IM1th and perform the skipping switching when the effective value of the current IM1 is large at a value equal to or greater than the threshold IM1th. Accordingly, because the complementary switching is performed when the current IM1 is small, the FETs are brought into conduction in periods other than the dead time. It thus becomes possible to achieve a power converter having a small conduction loss (high power conversion efficiency).

When the current IM1 is large, the skipping switching is performed in a case where a flowing current of the semiconductor switches S2a and S2b and the semiconductor switches S3a and S3b is negative. Accordingly, energization times for the FET2a and the FET2b and for the FET3a and the FET3b can be shorter and heat generation in the FET2a and the FET2b and in the FET3a and the FET3b can be reduced. It thus becomes possible to lower the temperatures of the FET2a and the FET2b and of the FET3a and the FET3b. Consequently, an energization current of the power converter that is otherwise limited by the temperatures of the FETs can be increased and maximum output power can be therefore increased.

As has been described, the power converter of the second embodiment is a three-level voltage-sourced power converter having four (two sets of) semiconductor switches, each of which is formed of an FET and a free wheel diode connected in anti-parallel to the FET, and formed by connecting the two sets of semiconductor switches to capacitors each serving as a voltage source. The power converter is provided with a current sensor CS1 that detects a direction of a current flowing through the semiconductor switches. Power conversion efficiency can be increased by performing the complementary switching when the current flowing through the semiconductor switches is small. Maximum output power of the power converter can be increased by performing the skipping switching to skip ON signals of PWM gate signals when the current flowing through the semiconductor switches is large and negative.

Herein, the gate generation portions 12 and 13 are provided separately. It should be appreciated, however, that the gate generation portions 12 and 13 may be combined into one unit.

The second embodiment has described the three-level voltage-sourced power converter using two sets of semiconductor switches. It should be appreciated, however, that the same advantage can be achieved with a multi-level ((n+1)-level) voltage-sourced power converter using two or more sets (n sets) of semiconductor switches as is described in Japanese Patent No. 3414749.

Further, the same advantage can be also achieved with another type of a multi-level ((n+1)-level) voltage-sourced power converter using n sets of semiconductor switches, n capacitors, and a diode as is described in POWER ELECTRONICS CIRCUIT compiled by DENKI GAKKAI-HANDOUTAI DENRYOKU HENKAN It should be appreciated that the respective embodiments of the invention described above can be combined arbitrarily and the respective embodiments can be changed or omitted as needed within the scope of the invention.

Various modifications and alterations of this invention will be apparent to those skilled in the art without departing from the scope and spirit of this invention, and it should be understood that this is not limited to the illustrative embodiments set forth herein.

What is claimed is:

1. A power converter, comprising:
one set of two semiconductor switches performing switching actions, each of which is formed of an FET and a free wheel diode connected in anti-parallel to the FET and only one of which is energized to convert power by the switching actions;
a smoothing capacitor;
a portion that detects a direction of a current flowing through the semiconductor switches; and
a control portion that makes PWM gate signals of the semiconductor switches into gate signals in which ON signals are skipped either partially or entirely relative to complementary gate signals when the direction of the current flowing through the semiconductor switches is negative,
wherein the control portion comprises a PWM generation portion, a mode selection portion, and a gate skipping portion,
wherein the PWM generation portion receives at least a voltage command signal, the mode selection portion receives at least a detection current, and the gate skipping portion receives at least the complementary gate signals from the PWM generation portion, a mode signal from the mode selection portion, and the detection current.

2. The power converter according to claim 1, wherein there are n sets of two semiconductor switches and n smoothing capacitors, n=1.

3. The power converter according to claim 1, wherein there are n sets of two semiconductor switches and n smoothing capacitors, n=2.

4. The power converter according to claim 1, wherein the FETs are made of a wide band-gap semiconductor including SiC and GaN.

5. The power converter according to claim 1, wherein the free wheel diodes are Schottky barrier diodes using a wide band-gap semiconductor including SiC and GaN.

6. The power converter according to claim 1, wherein the mode signal determines an operating mode of the gate skipping portion.

7. The power converter according to claim 6, wherein the operating mode is one of a skipping switching mode and complementary switching mode.

8. A power converter, comprising:
one set of two semiconductor switches performing switching actions, each of which is formed of an FET and a free wheel diode connected in anti-parallel to the FET and only one of which is energized to convert power by the switching actions;
a smoothing capacitor;
a portion that detects a direction of a current flowing through the semiconductor switches;
a control portion that makes PWM gate signals of the semiconductor switches into gate signals in which ON signals are skipped either partially or entirely relative to complementary gate signals when the direction of the current flowing through the semiconductor switches is negative; and
a portion that detects a temperature of the semiconductor switches,
wherein the control portion makes the PWM gate signals into gate signals in which ON signals are skipped either partially or entirely relative to the complementary gate signals when the semiconductor switches are hot at a temperature as high as or above a predetermined temperature and the direction of the current flowing through the semiconductor switches is negative, and outputs the complementary gate signals when the semiconductor switches are cold at a temperature below the predetermined temperature.

9. A power converter, comprising:
one set of two semiconductor switches performing switching actions, each of which is formed of an FET and a free wheel diode connected in anti-parallel to the FET and only one of which is energized to convert power by the switching actions;
a smoothing capacitor;
a portion that detects a direction of a current flowing through the semiconductor switches;
a control portion that makes PWM gate signals of the semiconductor switches into gate signals in which ON signals are skipped either partially or entirely relative to complementary gate signals when the direction of the current flowing through the semiconductor switches is negative; and
a portion that detects a temperature of a heat sink used to cool the semiconductor switches,
wherein the control portion makes the PWM gate signals into gate signals in which ON signals are skipped either partially or entirely relative to the complementary gate signals when the heat sink is hot at a temperature as high as or above a predetermined temperature and the direction of the current flowing through the semiconductor switches is negative, and outputs the complementary gate signals when the heat sink is cold at a temperature below the predetermined temperature.

10. A power converter, comprising:
one set of two semiconductor switches performing switching actions, each of which is formed of an FET and a free wheel diode connected in anti-parallel to the FET and only one of which is energized to convert power by the switching actions;
a smoothing capacitor;
a portion that detects a direction of a current flowing through the semiconductor switches;
a control portion that makes PWM gate signals of the semiconductor switches into gate signals in which ON signals are skipped either partially or entirely relative to complementary gate signals when the direction of the current flowing through the semiconductor switches is negative; and
a portion that detects a temperature of a refrigerant in a heat sink used to cool the semiconductor switches,
wherein the control portion makes the PWM gate signals into gate signals in which ON signals are skipped either partially or entirely relative to the complementary gate signals when the refrigerant is hot at a temperature as high as or above a predetermined temperature and the direction of the current flowing through the semiconductor switches is negative, and outputs the complementary gate signals when the refrigerant is cold at a temperature below the predetermined temperature.

11. A power converter, comprising:
one set of two semiconductor switches performing switching actions, each of which is formed of an FET and a free wheel diode connected in anti-parallel to the FET and only one of which is energized to convert power by the switching actions;
a smoothing capacitor;
a portion that detects a direction of a current flowing through the semiconductor switches;
a control portion that makes PWM gate signals of the semiconductor switches into gate signals in which ON signals are skipped either partially or entirely relative to complementary gate signals when the direction of the current flowing through the semiconductor switches is negative; and
a portion that detects magnitude of the current flowing through the semiconductor switches,
wherein the control portion makes the PWM gate signals into gate signals in which ON signals are skipped either partially or entirely relative to the complementary gate signals when the magnitude of the current flowing through the semiconductor switches is large at a value equal to or greater than a predetermined threshold and the direction of the current flowing through the semiconductor switches is negative, and outputs the PWM gate signals as the complementary gate signals when the current flowing through the semiconductor switches is small at a value less than the predetermined threshold.

12. The power converter according to claim 11, wherein there are n sets of two semiconductor switches and n smoothing capacitors, and n=1.

13. The power converter according to claim 11, wherein there are n sets of two semiconductor switches and n smoothing capacitors, and n=2.

14. The power converter according to claim 11, wherein the FETs are made of a wide band-gap semiconductor including SiC and GaN.

15. The power converter according to claim 11, wherein the free wheel diodes are Schottky barrier diodes using a wide band-gap semiconductor including SiC and GaN.

16. The power converter according to claim 11, wherein the mode signal determines an operating mode of the gate skipping portion.

17. The power converter according to claim 16, wherein the operating mode is one of a skipping switching mode and complementary switching mode.

* * * * *